United States Patent
Kuo

(10) Patent No.: US 8,928,157 B2
(45) Date of Patent: Jan. 6, 2015

(54) ENCAPSULATION TECHNIQUES FOR LEADLESS SEMICONDUCTOR PACKAGES

(75) Inventor: Frank Kuo, Kaohsiung (TW)

(73) Assignee: Vishay-Siliconix, Santa Clara, CA (US)

( * ) Notice: Subject to any disclaimer, the term of this patent is extended or adjusted under 35 U.S.C. 154(b) by 267 days.

(21) Appl. No.: 12/401,549

(22) Filed: Mar. 10, 2009

(65) Prior Publication Data

US 2009/0174055 A1   Jul. 9, 2009

Related U.S. Application Data

(60) Continuation of application No. 10/789,799, filed on Feb. 27, 2004, now Pat. No. 7,501,086, which is a division of application No. 10/113,526, filed on Mar. 28, 2002, now Pat. No. 6,856,006.

(51) Int. Cl.
*H01L 33/00*   (2010.01)
*H01L 23/495*  (2006.01)
*H01L 23/28*   (2006.01)
*H01L 21/56*   (2006.01)
*H01L 23/31*   (2006.01)

(52) U.S. Cl.
CPC ....... *H01L 21/565* (2013.01); *H01L 2924/0002* (2013.01); *H01L 23/3107* (2013.01)
USPC ............................ 257/787; 257/100; 257/667

(58) Field of Classification Search
USPC ............... 438/15, 25, 106; 257/100, 667, 787
See application file for complete search history.

(56) References Cited

U.S. PATENT DOCUMENTS

| | | | |
|---|---|---|---|
| 4,554,126 A | 11/1985 | Sera | |
| 4,900,501 A | 2/1990 | Saeki et al. | |
| 4,946,633 A * | 8/1990 | Saeki et al. | 264/40.1 |
| 4,978,867 A | 12/1990 | Pfennings | |
| 4,983,110 A * | 1/1991 | Yoshida et al. | 425/116 |
| 5,049,526 A | 9/1991 | McShane et al. | |
| 5,052,907 A | 10/1991 | Matumoto et al. | |
| 5,059,373 A | 10/1991 | Hirabayashi | |
| 5,218,759 A | 6/1993 | Juskey et al. | |
| 5,302,850 A * | 4/1994 | Hara | 257/667 |
| 5,563,103 A * | 10/1996 | Komatsu | 29/827 |
| 5,629,563 A | 5/1997 | Takiar et al. | |
| 5,635,115 A | 6/1997 | Konishi et al. | |

(Continued)

FOREIGN PATENT DOCUMENTS

EP   1115154   7/2001
GB   1255073   11/1971

(Continued)

OTHER PUBLICATIONS

U.S. Appl. No. 11/479,619; King Owyang.

(Continued)

*Primary Examiner* — James Mitchell

(57) ABSTRACT

An encapsulation technique for leadless semiconductor packages entails: (a) attaching a plurality of dice (411) to die pads in cavities (41-45, 51-55) of a leadframe, the cavities arranged in a matrix of columns and rows; (b) electrically connecting the dice to a plurality of conducting portions (412-414) of the leadframe; and (c) longitudinally injecting molding material into the cavities along the columns via a plurality of longitudinal gates (46-49, 56-59) of the leadframe to package the dice in the cavities, the longitudinal gates situated between the cavities along the columns.

8 Claims, 5 Drawing Sheets

(56) References Cited

U.S. PATENT DOCUMENTS

| | | | |
|---|---|---|---|
| 5,645,864 A | 7/1997 | Higuchi | |
| 5,672,550 A * | 9/1997 | Tsuji et al. | 264/272.17 |
| 5,753,529 A | 5/1998 | Chang et al. | |
| 5,757,081 A | 5/1998 | Chang et al. | |
| 5,897,883 A | 4/1999 | Cho et al. | |
| 5,932,254 A | 8/1999 | Mitchell et al. | |
| 6,046,507 A | 4/2000 | Hatchard et al. | |
| 6,066,890 A | 5/2000 | Tsui et al. | |
| 6,114,192 A * | 9/2000 | Tsunoda et al. | 438/126 |
| 6,143,981 A * | 11/2000 | Glenn | 174/534 |
| 6,173,490 B1 | 1/2001 | Lee et al. | |
| 6,214,273 B1 | 4/2001 | Liang et al. | |
| 6,271,060 B1 | 8/2001 | Zandman et al. | |
| 6,307,272 B1 | 10/2001 | Takahashi et al. | |
| 6,313,520 B1 | 11/2001 | Yoshida et al. | |
| 6,315,540 B1 * | 11/2001 | Tsuruta | 425/123 |
| 6,316,287 B1 | 11/2001 | Zandman et al. | |
| 6,316,821 B1 | 11/2001 | Chang et al. | |
| 6,319,450 B1 | 11/2001 | Chua et al. | |
| 6,326,232 B1 * | 12/2001 | Tani et al. | 438/106 |
| 6,330,165 B1 | 12/2001 | Kohjiro et al. | |
| 6,338,813 B1 | 1/2002 | Hsu et al. | |
| 6,344,162 B1 * | 2/2002 | Miyajima | 264/272.14 |
| 6,351,033 B1 | 2/2002 | Lotfi et al. | |
| 6,441,475 B2 | 8/2002 | Zandman et al. | |
| 6,448,643 B2 | 9/2002 | Cheah et al. | |
| 6,465,277 B2 | 10/2002 | Lee et al. | |
| 6,482,675 B2 | 11/2002 | Hsu et al. | |
| 6,501,160 B1 * | 12/2002 | Higuchi et al. | 257/675 |
| 6,524,886 B2 | 2/2003 | Lee | |
| 6,562,647 B2 | 5/2003 | Zandman et al. | |
| 6,627,976 B1 * | 9/2003 | Chung et al. | 257/666 |
| 6,670,220 B2 * | 12/2003 | Sakuraba et al. | 438/109 |
| 6,713,676 B2 | 3/2004 | Fischer | |
| 6,798,180 B2 | 9/2004 | Sase et al. | |
| 6,856,006 B2 * | 2/2005 | Kuo | 257/667 |
| 6,876,061 B2 | 4/2005 | Zandman et al. | |
| 6,888,064 B2 | 5/2005 | Gilliland | |
| 6,893,903 B2 | 5/2005 | Ochiai et al. | |
| 6,913,950 B2 | 7/2005 | Kobayakawa | |
| 6,940,724 B2 | 9/2005 | Divakar et al. | |
| 6,949,835 B2 | 9/2005 | Konishi et al. | |
| 6,992,528 B2 | 1/2006 | Akamine et al. | |
| 7,091,606 B2 | 8/2006 | Sakamoto et al. | |
| 7,211,877 B1 | 5/2007 | Zandman et al. | |
| 7,214,562 B2 * | 5/2007 | Lum et al. | 438/106 |
| 7,242,076 B2 | 7/2007 | Dolan | |
| 7,304,370 B2 | 12/2007 | Imaizumi et al. | |
| 7,489,021 B2 | 2/2009 | Juskey et al. | |
| 7,741,710 B2 | 6/2010 | Ichitsubo et al. | |
| 7,852,185 B2 | 12/2010 | Gardner et al. | |
| 8,471,381 B2 | 6/2013 | Owyang et al. | |
| 2001/0049159 A1 * | 12/2001 | Hsu et al. | 438/112 |
| 2002/0073032 A1 | 6/2002 | Holmes et al. | |
| 2004/0075169 A1 | 4/2004 | Yamada et al. | |
| 2004/0125576 A1 | 7/2004 | Lin et al. | |
| 2004/0212074 A1 | 10/2004 | Divakar et al. | |
| 2005/0029617 A1 | 2/2005 | Kameda et al. | |
| 2005/0073032 A1 | 4/2005 | Tao | |
| 2005/0156204 A1 | 7/2005 | Uno et al. | |
| 2005/0173783 A1 | 8/2005 | Chow et al. | |
| 2006/0145319 A1 | 7/2006 | Sun et al. | |

FOREIGN PATENT DOCUMENTS

| | | | |
|---|---|---|---|
| JP | 358128745 | | 8/1983 |
| JP | 60-165730 | * | 8/1985 |
| JP | 62-150834 | * | 7/1987 |
| JP | 02-110945 | * | 4/1990 |
| JP | 04345073 | | 12/1992 |
| JP | 06-314717 | | 11/1994 |
| JP | 8340193 | | 12/1996 |
| JP | 09-153506 | | 6/1997 |
| JP | 2000031180 A | | 1/2000 |
| JP | 2004140305 A | | 5/2004 |
| JP | 2004-228402 | | 12/2004 |
| JP | 2006049569 A | | 2/2006 |

OTHER PUBLICATIONS

U.S. Appl. No. 11/479,619, filed Jun. 30, 2006, Owyang et al.

* cited by examiner

ENCAPSULATION TECHNIQUES FOR LEADLESS SEMICONDUCTOR PACKAGES

CROSS-REFERENCE TO RELATED APPLICATIONS

This is a continuation of U.S. patent application Ser. No. 10/789,799 filed Feb. 27, 2004, which is a divisional of U.S. patent application Ser. No. 10/113,526 Filed Mar. 28, 2002, and are both incorporated herein by reference.

BACKGROUND OF THE INVENTION

Conventional encapsulation methods for packaging semiconductor devices are classified into two kinds. The first encapsulation method is applied to semiconductor packages with leads, as shown in FIG. 1. A plurality of dice are respectively mounted in cavities 11 of a leadframe 1, and are connected to the pins of the leadframe 1. The leadframe 1 has runner 12, and the runner 12 is connected to the cavities 11 by sub-runners 13 and gates 14. Each gate 14 is an injection inlet between a sub-runner 13 and a cavity 11. Molding material is injected into the runner 12 and moves via the sub-runners 13 and the gates 14 to cavities 11 so as to package the dice in cavities 11. This encapsulation method requires space for the runner 12 and the sub-runners 13, thereby decreasing the number of dice within the leadframe area, and does not have high packaging efficiency.

The second encapsulation method is applied to leadless semiconductor packages, as shown in FIG. 2. A plurality of dice 22 are placed in a cavity 21. Molding material is injected into the cavity 21 to package the dice 22. Therefore, the number of dice within the leadframe is increased, and the cost of the leadframe can be decreased. However, the second method must use cutting equipment to cut the packaged semiconductor devices into individual pieces, and the cutting equipment is usually expensive. Therefore, the cost of the second method is high. Furthermore, after the semiconductor devices are cut, every one of the semiconductor devices must be transferred to a tray or a tube so that the steps of the second method are complex and the efficiency of the second method is low.

Besides, as shown in FIG. 3, each packaged semiconductor device 3 has no contact leads. Instead, device 3 has a plurality of conducting portions 31 for connection to a circuit board. When the leadless semiconductor device 3 is packaged, molding flash must not remain on the conducting portions 31. Therefore, during the packaging process, a film at the bottom of the semiconductor device 3 is needed to prevent molding flash from remaining on the conducting portions 31. Such a film increases the cost of the second method and degrades the efficiency.

On the other hand, the second method must utilize an upper mold and a lower mold to clamp the periphery of the leadframe 2, and the molding material is injected into the cavity 21 formed by the upper and lower molds. Because the cavity 21 is large, the upper and lower molds can only clamp the periphery of the lead frame 2. The middle portion of the cavity 21 cannot be clamped by the upper and lower molds. This will easily cause molding flash to remain on the conducting portions 31.

Therefore, it is desirable to provide a creative and improved encapsulation method and leadframe to overcome the above problems.

SUMMARY OF THE INVENTION

One objective of the present invention is to provide a leadframe for leadless semiconductor packages. The present leadframe comprises: a plurality of cavities and a plurality of longitudinal gates. Each cavity has at least one die pad for supporting at least one die. Each cavity has a plurality of conducting portions for electrical connection to the die or dice on the die pad or pads. The cavities are arranged in a matrix configuration and classified into a plurality of columns and a plurality of rows. The longitudinal gates are situated between the cavities along the columns. Molding material is injected into the cavities along the columns via the longitudinal gates to package the dice in the cavities.

Therefore, the leadframe of the invention does not have the runner of the conventional leadframe, and can have more space to support more dice. The density of dice accommodated by the present leadframe can be high, and the packaging efficiency can be improved. Besides, the molding material remaining in the runner can be minimized by using the leadframe of the invention so as to decrease the manufacturing cost.

Another objective of the invention is to provide an encapsulation method for leadless semiconductor packages. The method comprises the steps of: (a) attaching a plurality of dice to die pads in a plurality of cavities of a leadframe, the cavities arranged in a matrix configuration and classified into a plurality of columns and a plurality of rows; (b) electrically connecting the dice on the die pads to a plurality of conducting portions of the leadframe; and (c) longitudinally injecting molding material into the cavities along the columns via a plurality of longitudinal gates of the leadframe to package the dice in the cavities, the longitudinal gates situated between the cavities along the columns.

The method of the invention does not need a film to prevent molding flash, and can solve the problem of molding flash remaining on the conducting portions. The method of the invention does not use expensive cutting equipment so as to decrease the cost and to upgrade the efficiency.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 4:
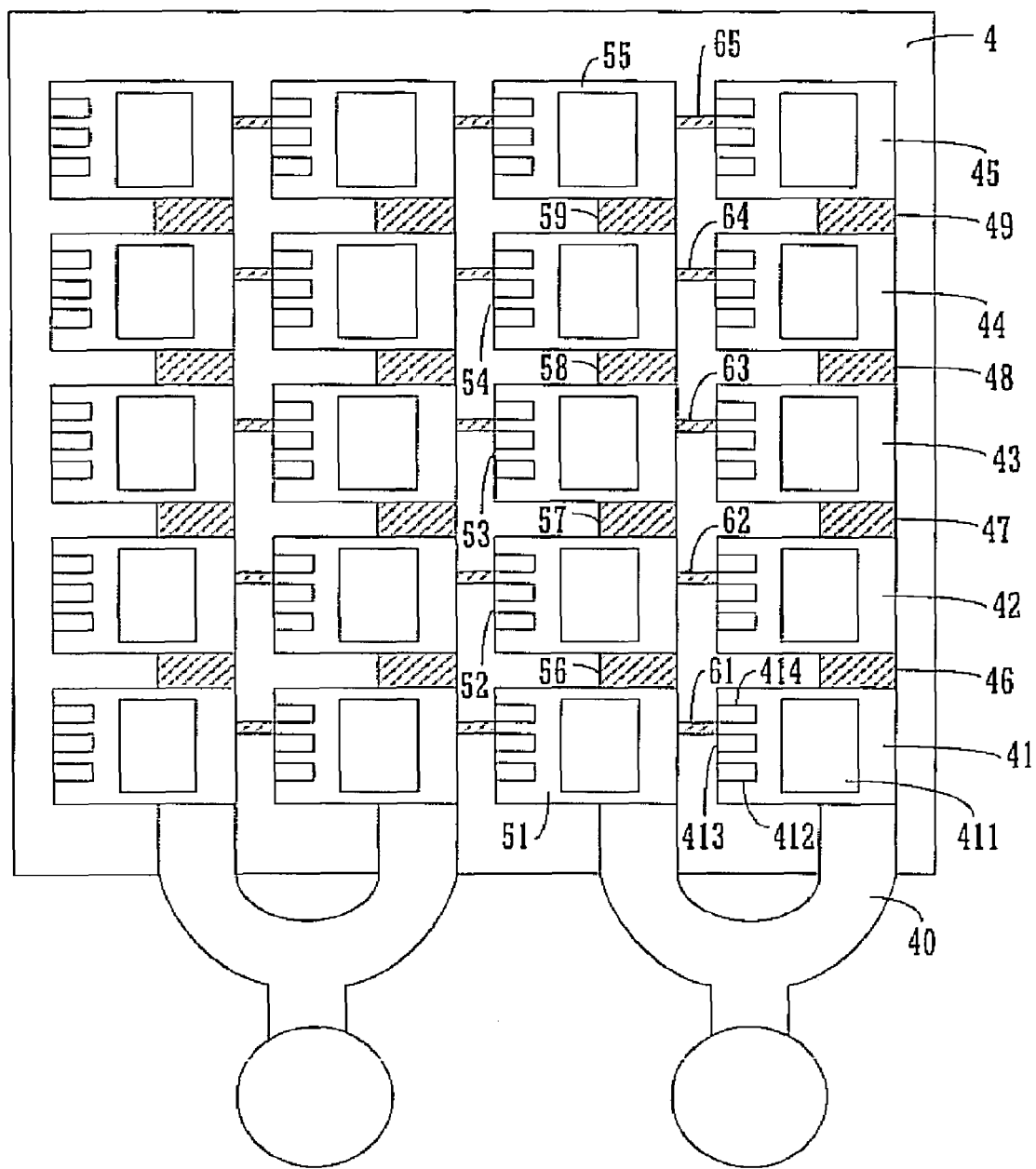
FIG. 4 shows a top-view of a leadframe for leadless semiconductor packages according to the present invention.

Referring to FIG. 4, according to the invention, a leadframe 4 for leadless semiconductor packages comprises a plurality of cavities 41, 42, 43, 44, 45, 51, 52, 53, 54, 55 and a plurality of inter-cavity longitudinal gates 46, 47, 48, 49, 56, 57, 58, 59. Each cavity has a die pad (not shown in the figure) for supporting a die. Die 411 is, for example, attached to its die pad in cavity 41. Each cavity has a plurality of conducting portions for electrical connection to the die on the die pad. For example, the cavity 41 has three conducting portions 412, 413 and 414. In the embodiment of the invention illustrated in FIG. 4, each cavity has one die pad for supporting a die. To improve the efficiency, each cavity can have a plurality of die pads for supporting a plurality of dice.

The cavities are arranged in a matrix configuration, and are classified into a plurality of columns and a plurality of rows. For example, the cavities 41, 42, 43, 44 and 45 form a first column, and the cavities 51, 52, 53, 54 and 55 form a second column. The cavities along the direction of cavities 41 and 51 form a first row, and the cavities along the direction of cavities 42 and 52 form a second row.

The inter-cavity longitudinal gates 46, 47, 48, 49, 56, 57, 58 and 59 are situated between the cavities along the columns. For example, the longitudinal gate 46 is situated between cavity 41 and cavity 42 for connecting the cavity 41 and the cavity 42. Similarly, the longitudinal gate 47 is situated between the cavity 42 and the cavity 43 for connecting the cavity 42 and the cavity 43. Therefore, the cavities 41, 42, 43, 44 and 45 are connected by the longitudinal gates 46, 47, 48 and 49. Similarly, the cavities 51, 52, 53, 54 and 55 are connected by the longitudinal gates 56, 57, 58 and 59.

Molding material is injected into the cavities along the columns of the leadframe 4 via the longitudinal gates to package the dice in the cavities. For example, firstly the molding material is injected into a first longitudinal gate 40 of the first column, and then flows into the cavity 41 of the first column via the first longitudinal gate 40. In sequence, the molding material flows into the longitudinal gate 46, the cavity 42, the longitudinal gate 47, the cavity 43, the longitudinal gate 48, the cavity 44, the longitudinal gate 49, and the cavity 45 to package the dice in the cavities along the first column.

Figure 1:
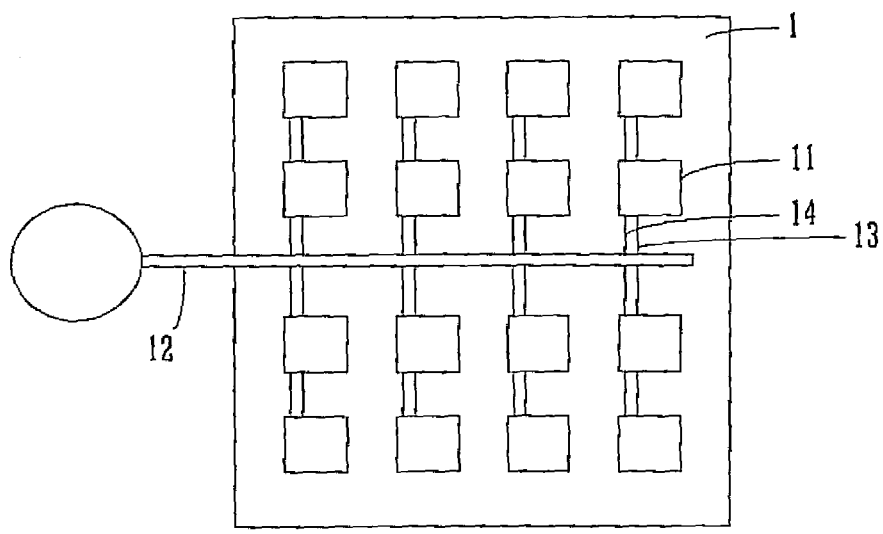
FIG. 1 shows a conventional leadframe for packaging semiconductor devices with leads.
Figure 2:
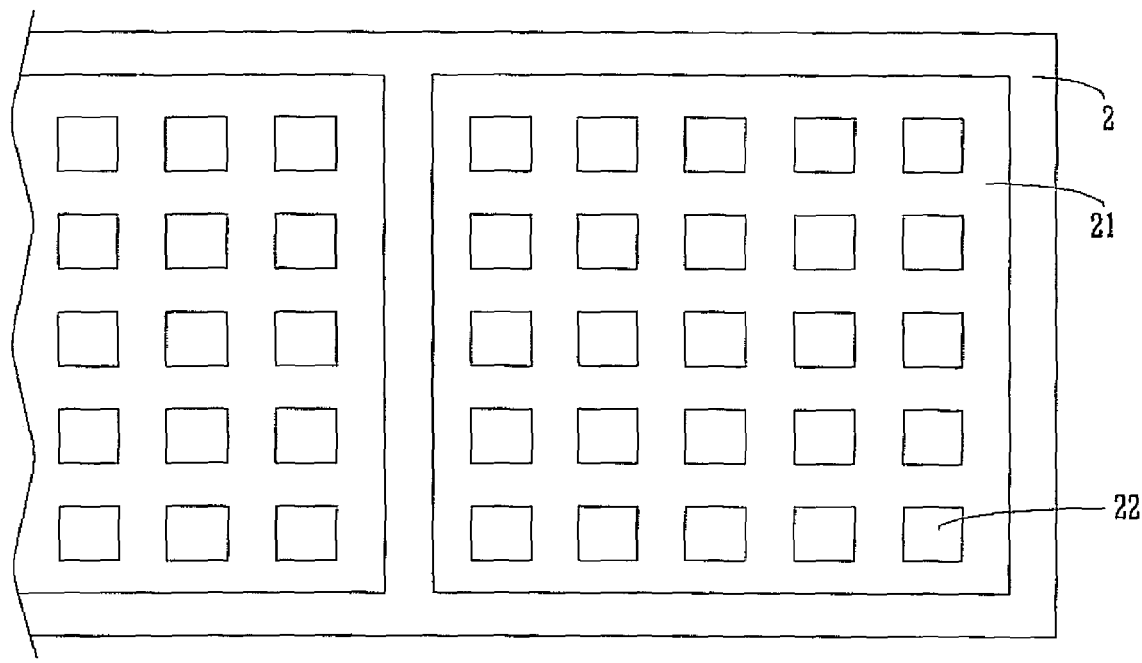
FIG. 2 shows a conventional leadframe for packaging leadless semiconductor devices.
Figure 3:
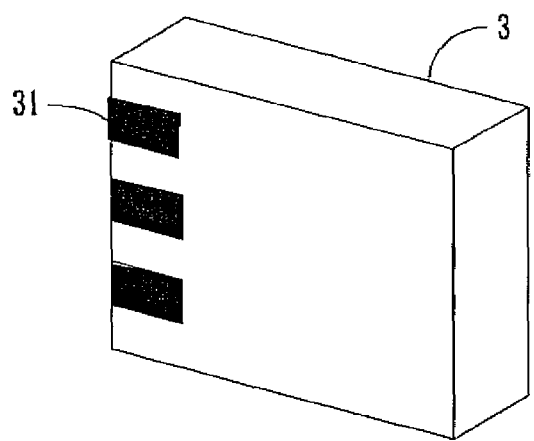
FIG. 3 shows a conventional leadless semiconductor device.

The leadframe 4 of the invention does not have the runner 12 as shown in the conventional leadframe 1 of FIG. 1, and the leadframe 4 can have more space to support more dice. The density of dice accommodated by the leadframe 4 can be high, and the packaging efficiency can be improved. Besides, the molding material left in the runner can be minimized by using the leadframe 4 of the invention so as to decrease the manufacturing cost.

According to the embodiment of the invention, to further improve the packaging quality, the leadframe 4 further comprises a plurality of transverse (or horizontal) gates 61, 62, 63, 64 and 65. The transverse gates are situated between the cavities along the rows. For example, the horizontal gate 61 is situated between the cavity 41 and the cavity 51 for connecting the cavity 41 and the cavity 51. Similarly, the transverse gate 62 is situated between the cavity 42 and the cavity 52 for connecting the cavity 42 and the cavity 52. When the molding material is injected into the cavities along the columns, the molding material can flow into the transverse gates so as to balance the pressure between the cavities along the rows. The bubbles induced in the cavities by the molding material can be drained by the transverse gates to further improve the packaging quality.

Figure 5:
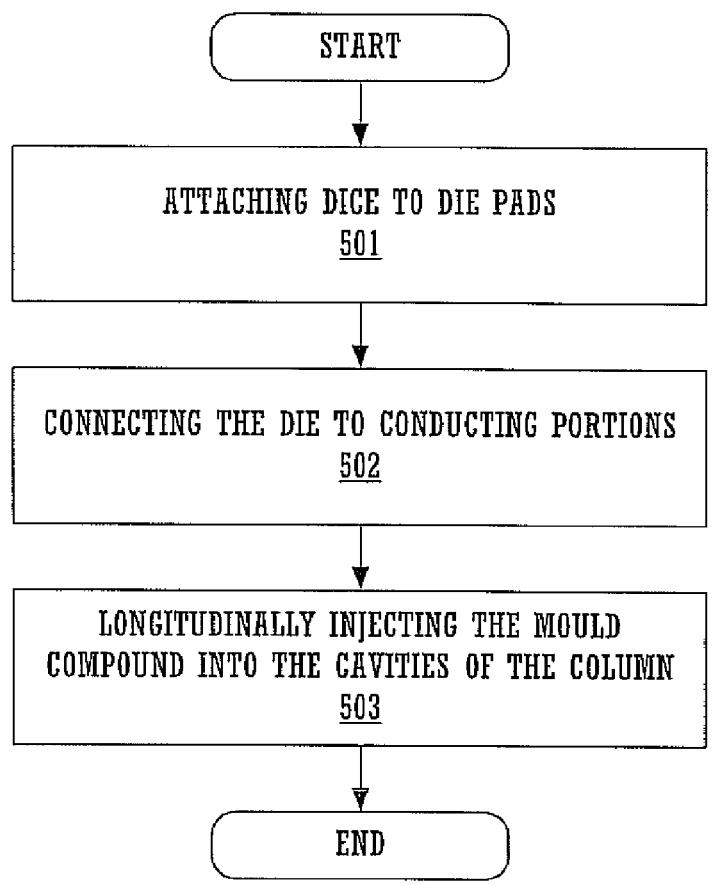
FIG. 5 shows a flow chart illustrating an encapsulation method for leadless semiconductor packages according to the present invention.

Referring to FIG. 5, the flow chart illustrates an encapsulation method for semiconductor packages according to the present invention. In step 501, the dice are attached to the die pads in the cavities of the leadframe 4. The leadframe 4 has a plurality of cavities arranged in a matrix configuration and classified into a plurality of columns and a plurality of rows. In step 502, the dice are electrically connected to the conducting portions of the leadframe 4.

In step 503, the molding material is injected longitudinally to package the dice. The molding material is injected into the cavities along the columns via the longitudinal gates to package the dice in the cavities along the columns. The longitudinal gates are situated between the cavities along the columns.

In step 503, the molding material can flow into the transverse gates so as to balance the pressure between the cavities along the rows and to drain the bubbles induced in the cavities by the molding material. The transverse gates are situated between the cavities along the rows.

The method of the invention does not need a film to prevent flash, and can solve the problem of molding flash remaining on the conducting portions. The method of the invention does not use expensive cutting equipment so as to decrease the cost and to upgrade the efficiency.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A semiconductor comprising:
a leadframe including a plurality of cavities arranged in a matrix and a plurality of gates between the plurality of cavities, wherein a first cavity, a second cavity and a third cavity are situated along a first column of the matrix, and wherein a first gate is separately connected between the first cavity and second cavity, and a second gate is separately connected between the second cavity and third cavity, wherein a fourth cavity, a fifth cavity and a sixth cavity are situated along a second column, and wherein a third gate is separately connected between the fourth cavity and fifth cavity, and a fourth gate is separately connected between the fifth cavity and sixth cavity, and wherein a fifth gate is separately connected between the first cavity and fourth cavity situated along a row of the matrix containing the first cavity and fourth cavity,
a plurality of die each disposed in a respective cavity of said plurality of cavities; and
a molding material in the first cavity, extending from the first cavity through the first gate into the second gate, extending from the second cavity through the second gate into the third cavity, in the fourth cavity, extending from the fourth cavity through the third gate into the fifth cavity, extending from the fifth cavity through the fourth gate into the sixth cavity, and extending from the first cavity through the fifth gate into the fourth cavity;

wherein the semiconductor is formed by;
attaching the plurality of dice to die pads in a plurality of cavities of the leadframe, wherein a die is attached in each of the plurality of cavities;
electrically connecting each of the plurality of die to a plurality of conducting portions of the leadframe;
causing a molding material to flow into the first cavity;
causing the molding material to flow from the first cavity into the second one cavity through the first gate of the leadframe; and
causing the molding material to flow from the first cavity into the fourth cavity through the fifth gate of the leadframe.

2. The semiconductor of claim 1, wherein the semiconductor is further formed by causing the molding material to flow from the second cavity into the third cavity through the second gate of the leadframe.

3. The semiconductor of claim 1, wherein the semiconductor is further formed by:
causing the molding material to flow from the fourth cavity into the fifth cavity through the third gate of the leadframe; and
causing said molding material to flow from the fifth cavity into the sixth cavity through the fourth gate of the leadframe.

4. An article comprising:
a leadframe including a plurality of cavities arranged in a matrix and a plurality of gates between the plurality of cavities,
a plurality of die each disposed in a respective cavity of said plurality of cavities;
molding material;
wherein the article is formed by a process comprising:
injecting a molding material into a first cavity of the plurality of cavities, from the first cavity through a first gate of the plurality of gates into a second cavity and from the second cavity through a second gate into a third cavity, wherein the first cavity, the second cavity and the third cavity are situated along a first column of the matrix, and wherein the first gate is separately connected between the first cavity and second cavity, and the second gate is separately connected between the second cavity and third cavity;
injecting the molding material into a fourth cavity, from the fourth cavity through a third gate into a fifth cavity and from the fifth cavity through a fourth gate into a sixth cavity, wherein the fourth cavity, the fifth cavity and the sixth cavity are situated along a second column, and wherein the third gate is separately connected between the fourth cavity and fifth cavity, and the fourth gate is separately connected between the fifth cavity and sixth cavity; and
causing the molding material to flow from the second cavity through a fifth gate into the fifth cavity, wherein the fifth gate is separately connected between the second cavity and fifth cavity situated along a row of the matrix containing the second cavity and fifth cavity.

5. The article formed by a process according to claim 4, wherein the molding material flows from the second cavity through the fifth gate into the fifth cavity in response to injecting the molding material along the first column and the second column.

6. The article formed by a process according to claim 5, wherein causing the molding material to flow from the second cavity through the fifth gate into the fifth cavity in response to injection the molding material along the first column and the second column is adapted to balance pressure between cavities in the first column and cavities in a second column.

7. The article formed by a process according to claim 5, wherein causing the molding material to flow from the second cavity through the fifth gate into the fifth cavity in response to injection the molding material along the first column and the second column is adapted to drain bubbles induced in the molding material.

8. The article formed by a process according to claim 5, further comprising electrically connecting the die to a plurality of conducting portions of the leadframe before injecting the molding material.

* * * * *